(12) United States Patent
Hoagland et al.

(10) Patent No.: US 8,749,261 B2
(45) Date of Patent: Jun. 10, 2014

(54) INTERFACES HAVING A PLURALITY OF CONNECTOR ASSEMBLIES

(75) Inventors: Scott Hoagland, Boise, ID (US); Daniel Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 348 days.

(21) Appl. No.: 13/025,587

(22) Filed: Feb. 11, 2011

(65) Prior Publication Data

US 2012/0206159 A1 Aug. 16, 2012

(51) Int. Cl.
*G01R 31/00* (2006.01)

(52) U.S. Cl.
USPC ............. 324/756.05; 324/756.01; 324/755.01

(58) Field of Classification Search
USPC ............. 324/750.16, 750.19, 750.24, 750.25, 324/754.03, 754.08, 754.09, 754.12, 324/754.13, 754.14, 754.18, 756.01, 324/756.03, 756.05, 756.07, 762.01, 762.05
See application file for complete search history.

(56) References Cited

U.S. PATENT DOCUMENTS

| | | | | |
|---|---|---|---|---|
| 4,423,917 A | * | 1/1984 | Scheingold et al. | 439/249 |
| 4,701,133 A | * | 10/1987 | Worth | 439/13 |
| 4,952,758 A | * | 8/1990 | Dara et al. | 200/51.09 |
| 4,954,094 A | * | 9/1990 | Humphrey | 439/247 |
| 5,024,627 A | * | 6/1991 | Bennett et al. | 439/631 |
| 5,489,852 A | | 2/1996 | Gomez | |
| 5,845,859 A | * | 12/1998 | Sato | 242/345 |
| 6,394,829 B1 | * | 5/2002 | Patterson et al. | 439/252 |
| 6,426,636 B1 | | 7/2002 | Das et al. | |
| 6,504,391 B2 | * | 1/2003 | Hamren | 324/750.25 |
| 6,822,466 B1 | * | 11/2004 | Holcombe et al. | 324/750.25 |
| 6,833,696 B2 | * | 12/2004 | Sinsheimer et al. | 324/750.25 |
| 6,869,321 B1 | * | 3/2005 | Ashby et al. | 439/851 |
| 6,963,211 B2 | * | 11/2005 | Sinsheimer et al. | 324/750.25 |
| 7,075,319 B2 | * | 7/2006 | Mori | 324/750.25 |
| 7,078,890 B2 | * | 7/2006 | Sinsheimer et al. | 324/750.25 |
| 7,358,754 B2 | * | 4/2008 | Sinsheimer et al. | 324/750.22 |
| 7,622,935 B2 | * | 11/2009 | Hobbs et al. | 324/756.03 |
| 2006/0006892 A1 | | 1/2006 | Green et al. | |
| 2006/0214679 A1 | | 9/2006 | Henson et al. | |
| 2007/0126439 A1 | * | 6/2007 | Sinsheimer et al. | 324/754 |
| 2010/0134134 A1 | * | 6/2010 | Grover et al. | 324/763 |

FOREIGN PATENT DOCUMENTS

JP 2009280285 A * 12/2009

* cited by examiner

*Primary Examiner* — Huy Q Phan
*Assistant Examiner* — James Split
(74) *Attorney, Agent, or Firm* — Dicke, Billig & Czaja, PLLC

(57) ABSTRACT

Embodiments of interfaces are disclosed. One such interface has a plurality of connector assemblies, each connector assembly in a single opening of a plurality of openings passing completely through the interface. Each connector assembly has first and second connectors that are electrically and physically coupled to each other.

20 Claims, 9 Drawing Sheets

US 8,749,261 B2

INTERFACES HAVING A PLURALITY OF CONNECTOR ASSEMBLIES

FIELD

The present disclosure relates generally to coupling components and in particular the present disclosure relates to interfaces.

BACKGROUND

Semiconductor components, such as dice and packages, are typically tested at the wafer level, e.g., prior to being singulated into separate components. The semiconductor components may include patterns of component contacts, such as bond pads, redistribution pads, or test pads, that provide electrical connection points for addressing integrated circuits contained on the components. A typical wafer-level test system may include a wafer handler (e.g., sometimes called a prober) for handling and positioning the wafers, a tester (e.g., sometimes called a test head) for generating test signals, and an interconnection device, such as probe card, for making temporary electrical connections with the wafer, e.g., with the component contacts of the semiconductor components on the wafer.

Problems may exist with conventional connectors that are sometimes used to connect the probe card to the tester. For example, some conventional connectors may have intermittent electrical contact behavior and/or may be unreliable.

Examples of connectors that may be used to connect a probe card to a tester include spring probe contacts and connector systems, such as zero insertion force (ZIF) connector systems. Spring probe contacts can be unreliable if contact surfaces are not relatively free of contaminants and often require frequent cleaning and/or replacement. Zero insertion force (ZIF) connectors can be expensive and may require complex add-on mechanical actuators.

For the reasons stated above, and for other reasons stated below which will become apparent to those skilled in the art upon reading and understanding the present specification, there is a need in the art for alternatives to existing connectors for connecting probe cards to testers.

DETAILED DESCRIPTION

Figure 1A:
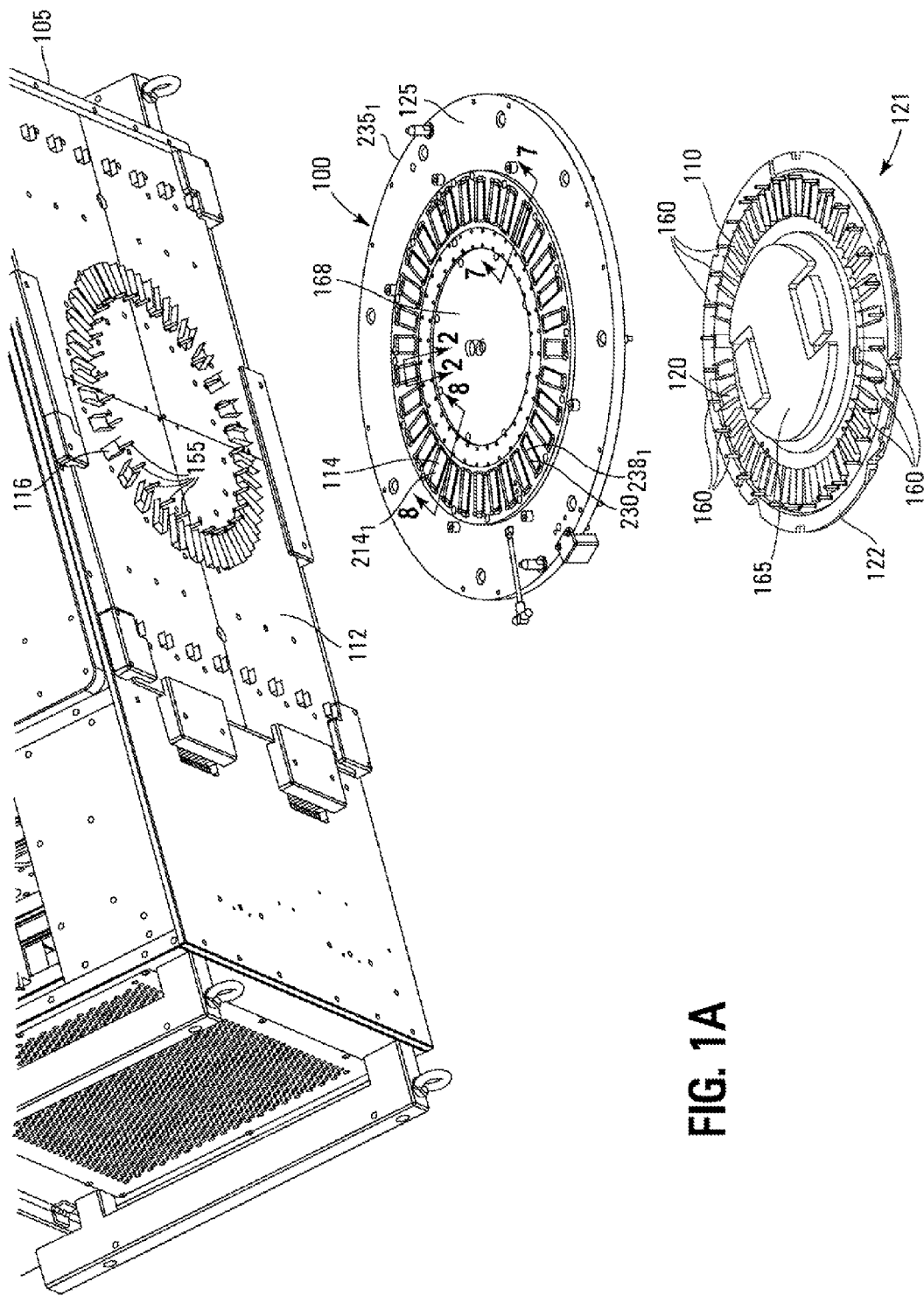
FIG. 1A is a top isometric view of an interface, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural and electrical changes may be made without departing from the scope of the present disclosure. The following detailed description is, therefore, not to be taken in a limiting sense.

FIG. 1A illustrates a top isometric view of an interface 100 in relation to an electronic apparatus, such as a tester 105 (e.g., that may be called a test head), and an interconnection device, such as probe card 110, according to an embodiment. Interface 100 is configured to physically (e.g., mechanically) and electrically couple tester 105 to probe card 110. Probe card 110 may be configured to make temporary electrical connections with semiconductor components, such as dice and packages, in order to temporarily electrically connect the semiconductor components to tester 105 for testing.

Interface 100 may be configured to be electrically and physically coupled to a backplane 112 of tester 105 that may be one of a plurality of (e.g., four) backplanes 112 of tester 105. For example, each of a plurality of (e.g., 32) connector assemblies (e.g., receptacles) 114 of interface 100 may electrically and physically connect to respective ones of electrical connectors 116 of backplane 112 and electrically and physically connect to respective ones of electrical connectors 120 of probe card 110.

Figure 1B:
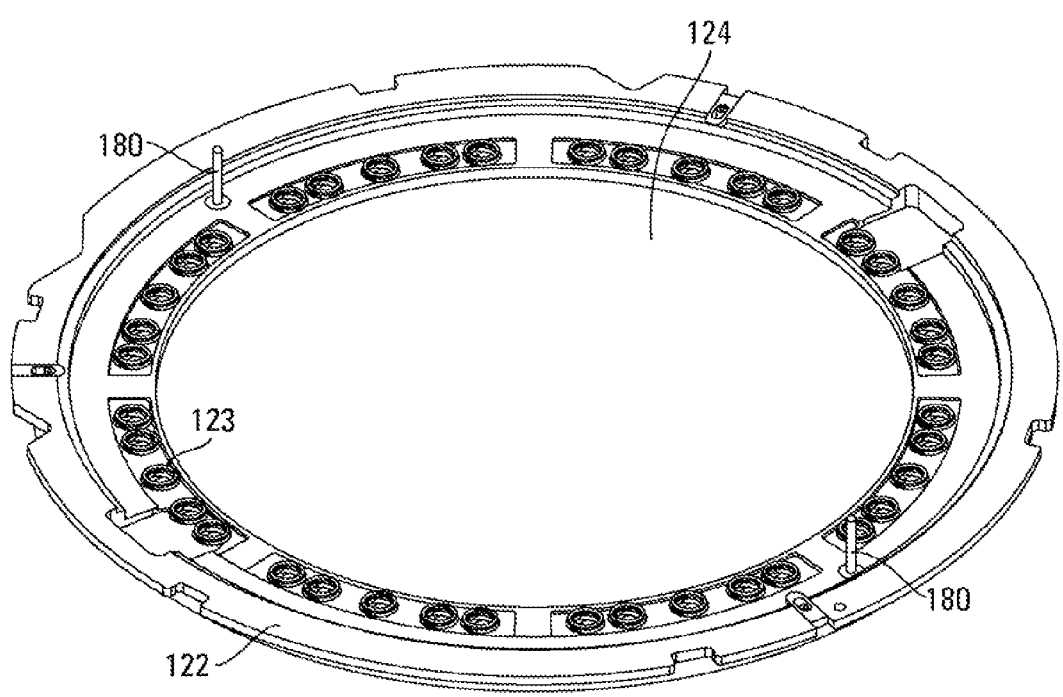
FIG. 1B is an isometric view of an example tray of an interconnection device, according to another embodiment.

For some embodiments, probe card 110 may be located in and, e.g., fastened to, a tray 122 (e.g., sometimes called a probe card tray), as shown in FIG. 1A. For example, probe card 110 and tray 122 may form a probe card assembly 121. FIG. 1B is an isometric view of an example tray 122. When located in tray 122, probe card 110 may be supported by a plurality of elastic devices, such as a plurality of springs 123 (e.g., 40 springs 123), located in tray 122. Springs 123 may be wave springs for some embodiments. As such, probe card 110 may be elastically coupled, by the elastic devices, to tray 122 for movement relative to tray 122. Tray 122 may include an opening 124 through which probe card 110 is exposed when probe card 110 is located in tray 122.

For some embodiments, an external force may be applied to tray 122. The external force acts to hold probe card assembly 121, and thus probe card 110, against interface 100 so that probe card 110 is electrically and physically coupled to interface 100. A handing device (e.g., that may be called a prober) that handles the semiconductor components and that positions probe card 110 adjacent to the semiconductor components may provide the external force. When the external force is applied to tray 122, springs 123 exert a force on probe card 110 that acts to push probe card 110 against interface 100.

Figure 2:
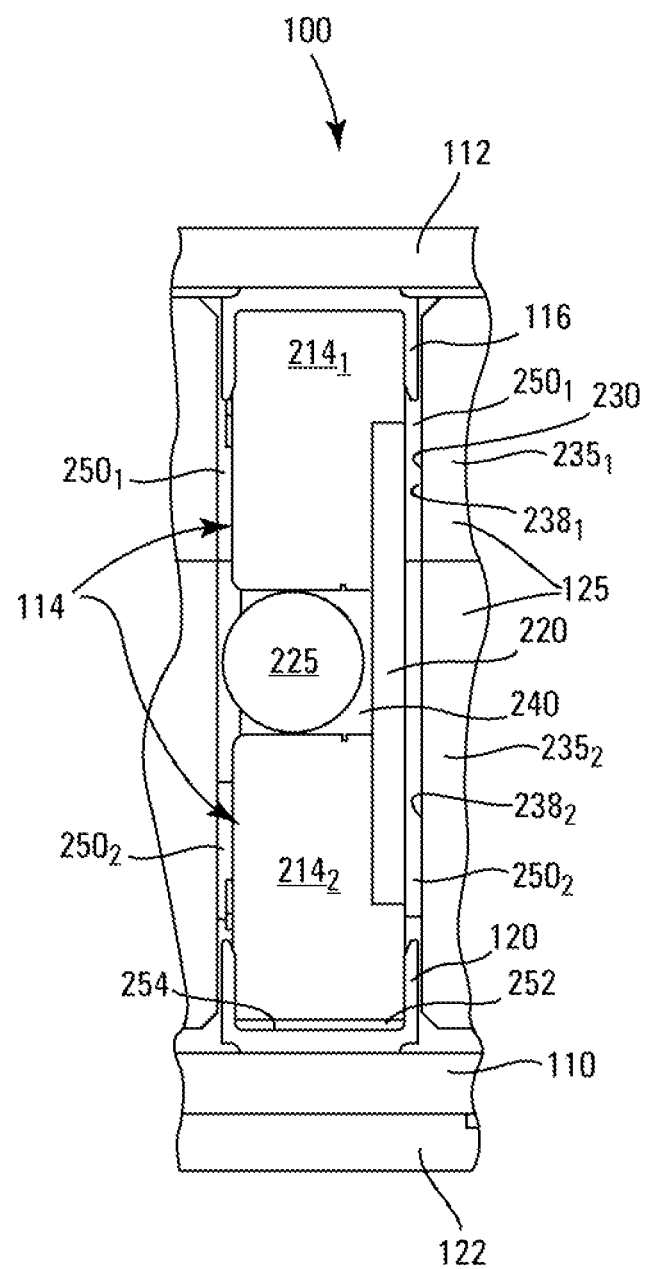
FIG. 2 is a cross-sectional view of a connector assembly, according to another embodiment.

FIG. 2 is a cross-sectional view (cross-hatching omitted) of a connector assembly 114 electrically and physically connected to a respective connector 116 and a respective connector 120, where the portion of FIG. 2 corresponding to connector assembly 114 is a cross-section viewed along line 2-2 in FIG. 1A. Each connector assembly 114 may include a connector $214_1$ that is physically and electrically connectable to the respective connector 116 and a connector $214_2$ that is physically and electrically connectable the respective connector 120.

Connectors $214_1$ and $214_2$ may each include a plurality of individual electrical conductors (e.g., 200), each for conveying a signal. For example, each of the individual conductors of connector $214_1$ may convey a signal to or from a respective circuit of connector 116, and thus of tester 105, and each of the individual conductors of connector $214_2$ may convey a signal to or from a respective circuit of connector 120, and thus of probe card 110.

For some embodiments, each connector assembly 114 may include a circuit board 220, such as printed circuit board, that electrically and physically couples the connectors $214_1$ and $214_2$ to each other. For example, circuit board 220 may include conductors that electrically and physically couple the connector $214_1$ to the connector $214_2$. As such, circuit board 220 electrically couples a respective connector 116 of backplane 112 of tester 105 to a respective connector 120 of probe card 110 through connectors 214. Note that the circuit boards 220 of the connector assemblies 114 may be physically and electrically isolated (e.g., separated) from each other. For some embodiments, connectors 214 may be Molex VHDM® female connectors (e.g., part number 74040-1214) and connectors 116 and connectors 120 may be Molex VHDM® pin header male connectors (e.g., part number 74060-2502).

When connectors $214_1$ and $214_2$ are female they include a plurality of sockets, where each socket corresponds to a conductor of the respective connector $214_1$ or $214_2$ and where each socket of connector $214_1$ receives a pin of male connector 116 and each socket of connector $214_2$ receives a pin of male connector 120. Alternatively, connectors 214 may be male and connectors 116 connectors 120 may be female.

For some embodiments, interface 100 may be configured to allow connector $214_1$ to be physically and electrically coupled to connector 116 without being fully seated within connector 116 and/or connector $214_2$ to be physically and electrically coupled to connector 120 without being fully seated within connector 120. This is indicated for connector $214_2$ and connector 120 in FIG. 2, where a gap 252 separates an end of connector $214_2$ from a seat 254 of connector 120. Although not shown, a similar gap may separate an end of connector $214_1$ from a seat of connector 116.

A pin 225 may pivotally couple each connector assembly 114 to a body 125 of interface 100, as shown in FIG. 2, so that each connector assembly 114 can pivot about pin 225 relative to body 125. Connector assemblies 114 may be located in respective ones of openings 230 that may pass completely through body 125 of interface 100, so that each connector assembly is in a single opening 230. The openings 230 may be physically isolated from each other, so as to contain a single connector assembly 114. Note that when a connector assembly 114 is in a single opening 230, its circuit board 220 is physically and electrically isolated (e.g., separate) from the circuit boards 220 of each of the connector assemblies 114 located in respective ones of the remaining openings 230.

For some embodiments, body 125 of interface 100 may include adjacent individual portions, such as plates $235_1$ and $235_2$, e.g., that may be butted together, as shown in FIG. 2. In such embodiments, a plurality of openings $238_1$ may pass completely through plate $235_1$, and a plurality of openings $238_2$ may pass completely through plate $235_2$. When plates $235_1$ and $235_2$ are butted together, each opening 230 may include an opening $238_1$ aligned with an opening $238_2$, as shown in FIG. 2 for a single opening 230. For example, opening $238_1$ and opening $238_2$ may be contiguous and form a single opening 230 when plates $235_1$ and $235_2$ are butted together.

Figure 3:
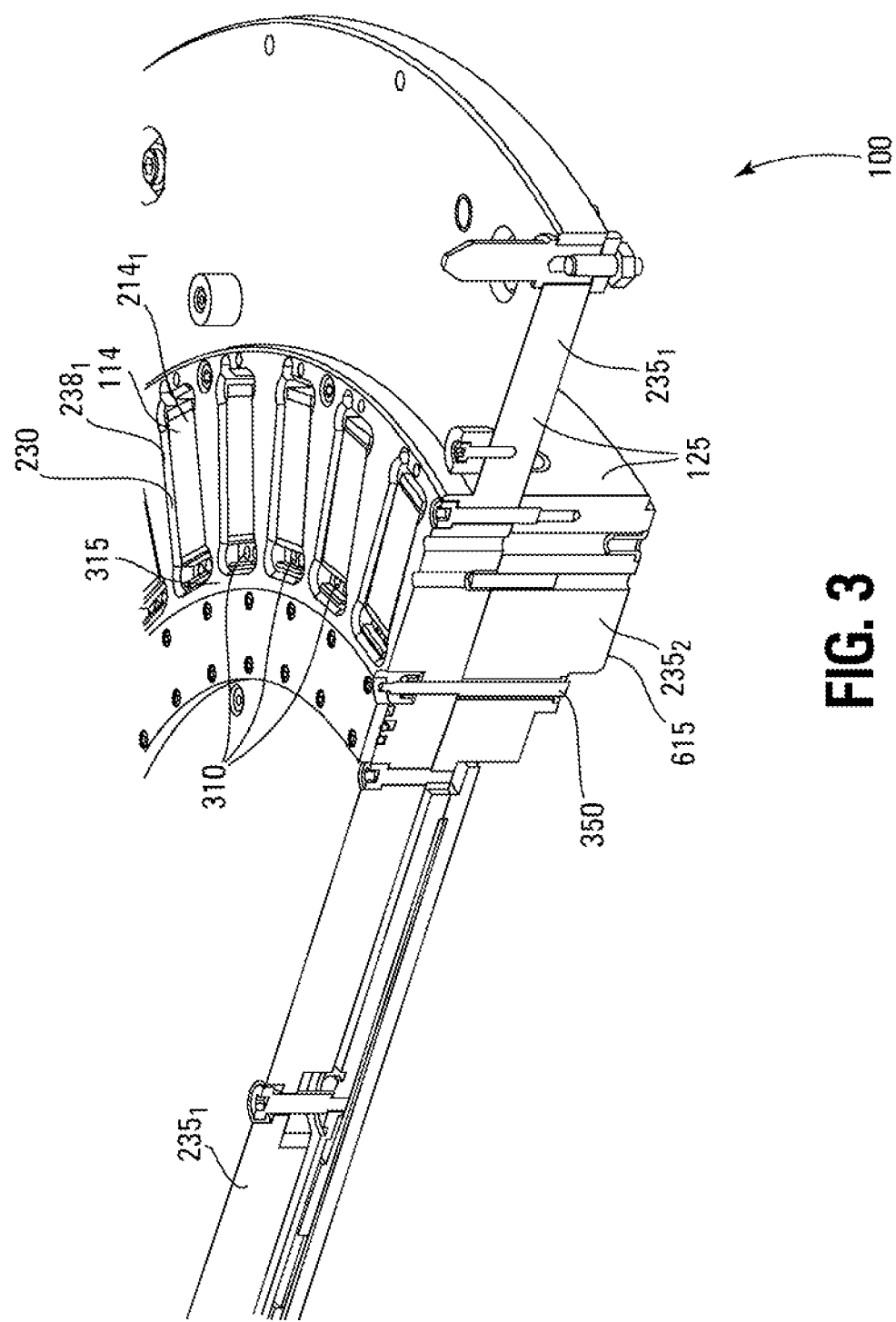
FIG. 3 is a top cutaway isometric view of an interface, according to another embodiment.

The detail of plate $235_1$ can be seen in FIG. 1A and in FIG. 3, a top cutaway isometric view of interface 100. FIG. 3 shows that each opening $238_1$ may pass through an upper surface of plate $235_1$ and that each connector $214_1$ of a respective connector assembly 114 may be exposed and accessible on a first side (e.g., tester side) of body 125 of interface 100 through a respective opening $238_1$.

Figure 4:
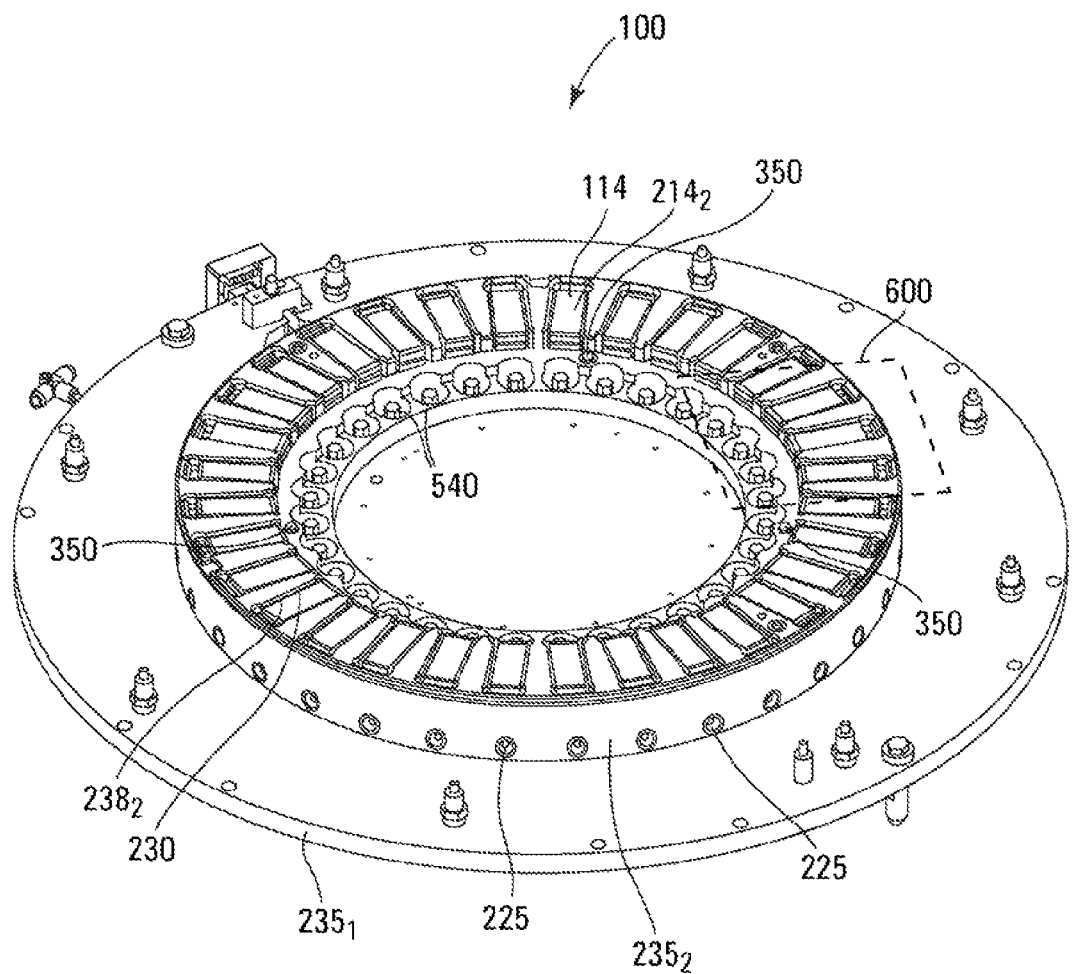
FIG. 4 is a bottom isometric view of an interface, according to another embodiment.

FIG. 4 is a bottom isometric view showing interface 100 inverted so that the detail of plate $235_2$ can be seen. FIG. 4 shows that each opening $238_2$ may pass through a lower surface of plate $235_2$ and that each connector $214_2$ of a respective connector assembly 114 may be exposed and accessible on a second side (e.g., probe-card side) of body 125 of interface 100 through a respective opening $238_2$, where the tester side and the probe-card side of body 125, and thus interface 100, face in opposite directions. This means that connectors $214_1$ and $214_2$ may face in opposite directions.

Note that each pin 225 may pass substantially radially through a sidewall of plate $235_2$ so as to pivotally couple a respective connector assembly 114 to plate $235_2$, as shown in FIG. 4.

Figure 5:
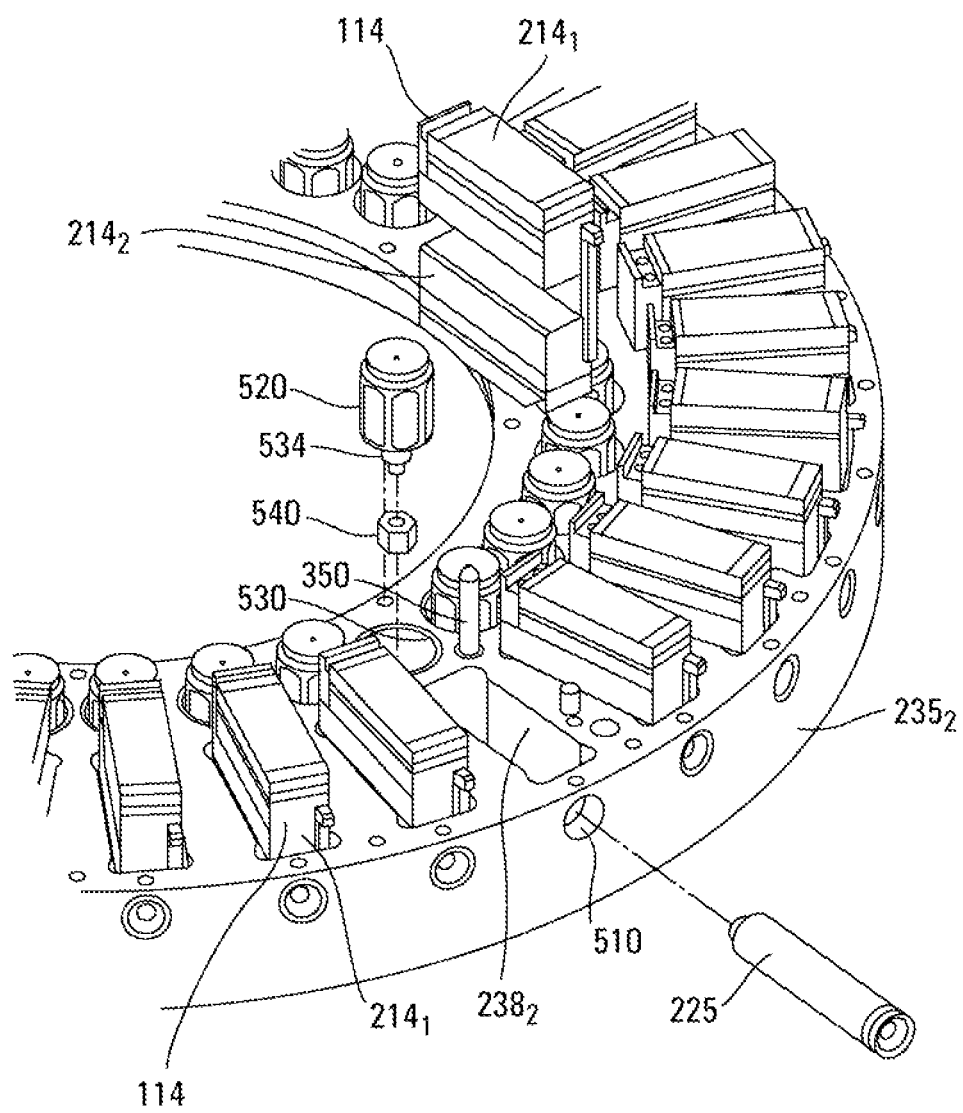
FIG. 5 is an exploded top isometric view of a portion of an interface, according to another embodiment.

FIG. 5 is an exploded top isometric view of a portion of plate $235_2$. As shown in FIG. 5, a connector assembly 114 may be inserted into a respective opening $238_2$. A respective pin 225 may then be inserted into an opening 510 in the sidewall of plate $235_2$ to pivotally couple the connector assembly 114 within the respective opening $238_2$. As best seen in FIG. 2, the respective pin 225 may pass through an opening 240 located in a connector assembly 114 between the connectors $214_1$ and $214_2$. At least a portion of each connector $214_1$ may extend above the upper surface of plate $235_2$, as shown in FIG. 5. This portion each connector $214_1$ may extend into and through a respective opening $238_1$ in plate $235_1$ when plate $235_1$ is butted against plate $235_2$, as shown in FIG. 2.

For some embodiments, each opening 230 may provide a gap 250 between each side of a respective connector assembly 114 and a sidewall of the respective opening 230. For example, a gap $250_1$ may be located between each side of a connector $214_1$ of the respective connector assembly 114 and a sidewall of a respective opening $238_1$ in plate $235_1$, and a gap $250_2$ may be located between each side of a connector $214_2$ of the respective connector assembly 114 and a sidewall of a respective opening $238_2$ in plate $235_2$, as shown in FIG. 2. The gaps 250 provide clearance that allows a connector assembly 114 to move (e.g., pivot about a respective pin 225) within a respective opening 230 relative to body 125. For example, a circuit board 220 may provide a substantially rigid physical coupling between connectors $214_1$ and $214_2$ of a respective connector assembly 114 so that connectors $214_1$ and $214_2$ and circuit board 220, and thus the respective connector assembly 114, can move as a single unit when pivoting about a respective pin 225.

Allowing connector assemblies 114 to move within openings 230 relative to body 125 of interface 100 provides a self-alignment feature that facilitates alignment between connector $214_1$ of a connector assembly 114 and a respective connector 116 of tester 105 or alignment between connector $214_2$ of that connector assembly 114 and a respective connector 120 of probe card 110. For example, when coupling connectors 116 of tester 105 to respective ones of connectors $214_1$, e.g., before coupling connectors 120 of probe card 110 to respective ones of connectors $214_2$, one or more of connectors $214_1$ may pivot, in response to engaging a respective connector 116, so as to align with the respective connector 116. Alternatively, when coupling connectors 120 of probe card 110 to respective ones of connectors $214_2$, e.g., before coupling connectors 116 of tester 105 to respective ones of connectors $214_1$, one or more of connectors $214_2$ may pivot, in response to engaging a respective connector 120, so as to align with the respective connector 120.

Figure 6:
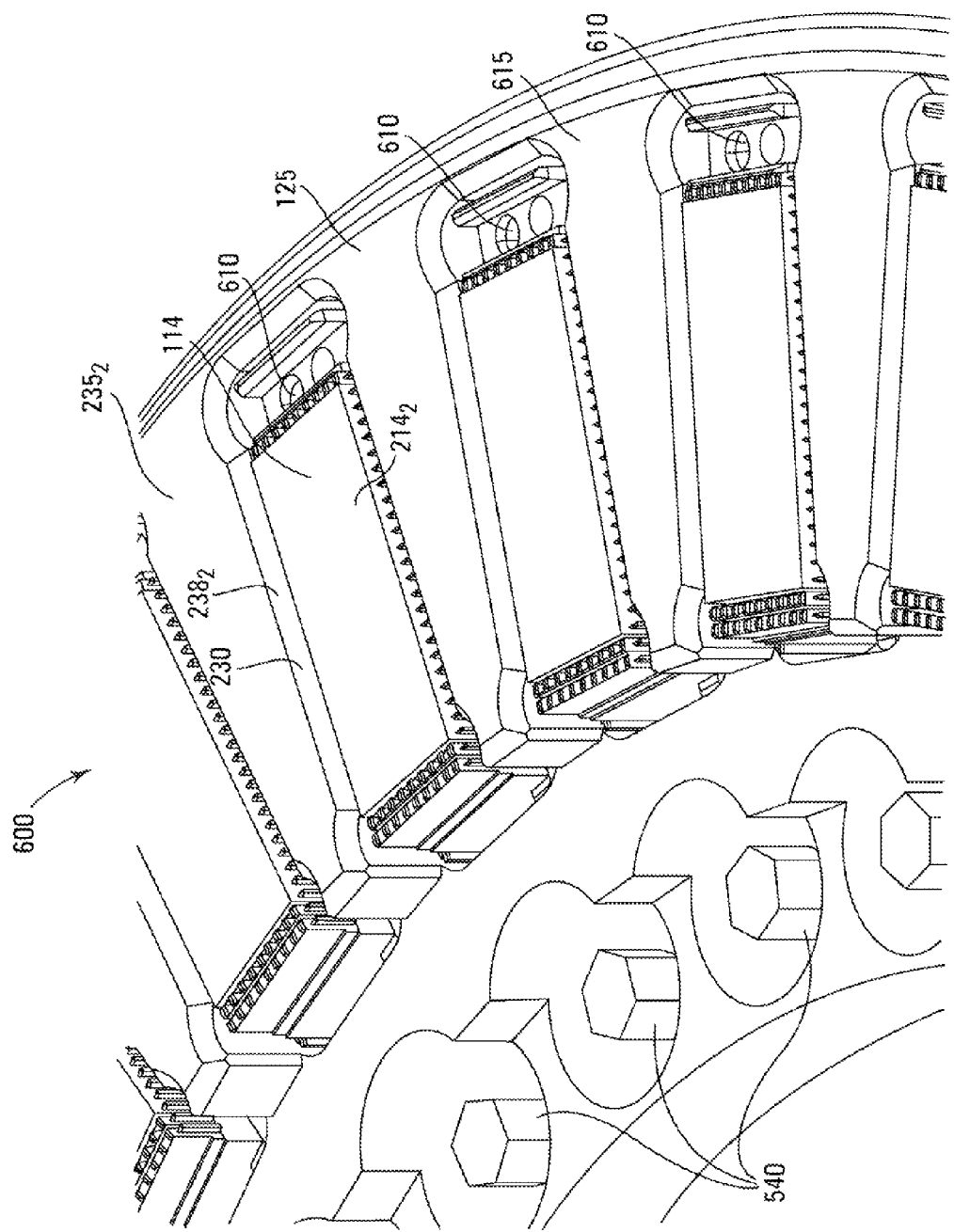
FIG. 6 is an enlarged view of region 600 in FIG. 4, according to another embodiment.

For some embodiments, a plurality of alignment openings 310 may be located adjacent to respective ones of connectors $214_1$ of connector assemblies 114, as shown in FIG. 3, and/or a plurality of alignment openings 610 may be located adjacent to respective ones of connectors $214_2$ of connector assemblies 114, as shown in FIG. 6, an enlarged view of region 600 in FIG. 4. Alignment openings 310 may extend into body 125 from adjacent to an upper surface 315 of plate $235_1$ on the tester side of interface 100 in a direction away from upper surface 315, where upper surface 315 and the tester side may face the tester when the tester is coupled to interface 100. Alignment openings 310 may receive respective ones of alignment posts 155 (FIG. 1A) that are adjacent to respective ones of connectors 116 of tester 105 as tester 105 is being positioned onto the tester side of interface 100. For some embodiments, tester 105 may be rotated as it is positioned onto the tester side of interface 100, as shown in FIG. 1A.

Alignment openings 610 may extend into body 125 from adjacent to a lower surface 615 of plate $235_2$ on the probe-card side of interface 100 in a direction away from lower surface 615, where lower surface 615 and the probe-card side may face the probe card when the probe card is coupled to interface 100. Alignment openings 610 may receive respective ones of alignment posts 160 (FIG. 1A) that are adjacent to respective ones of connectors 120 of probe card 110 as probe card is being positioned onto the probe card side of interface 100.

Figure 7:
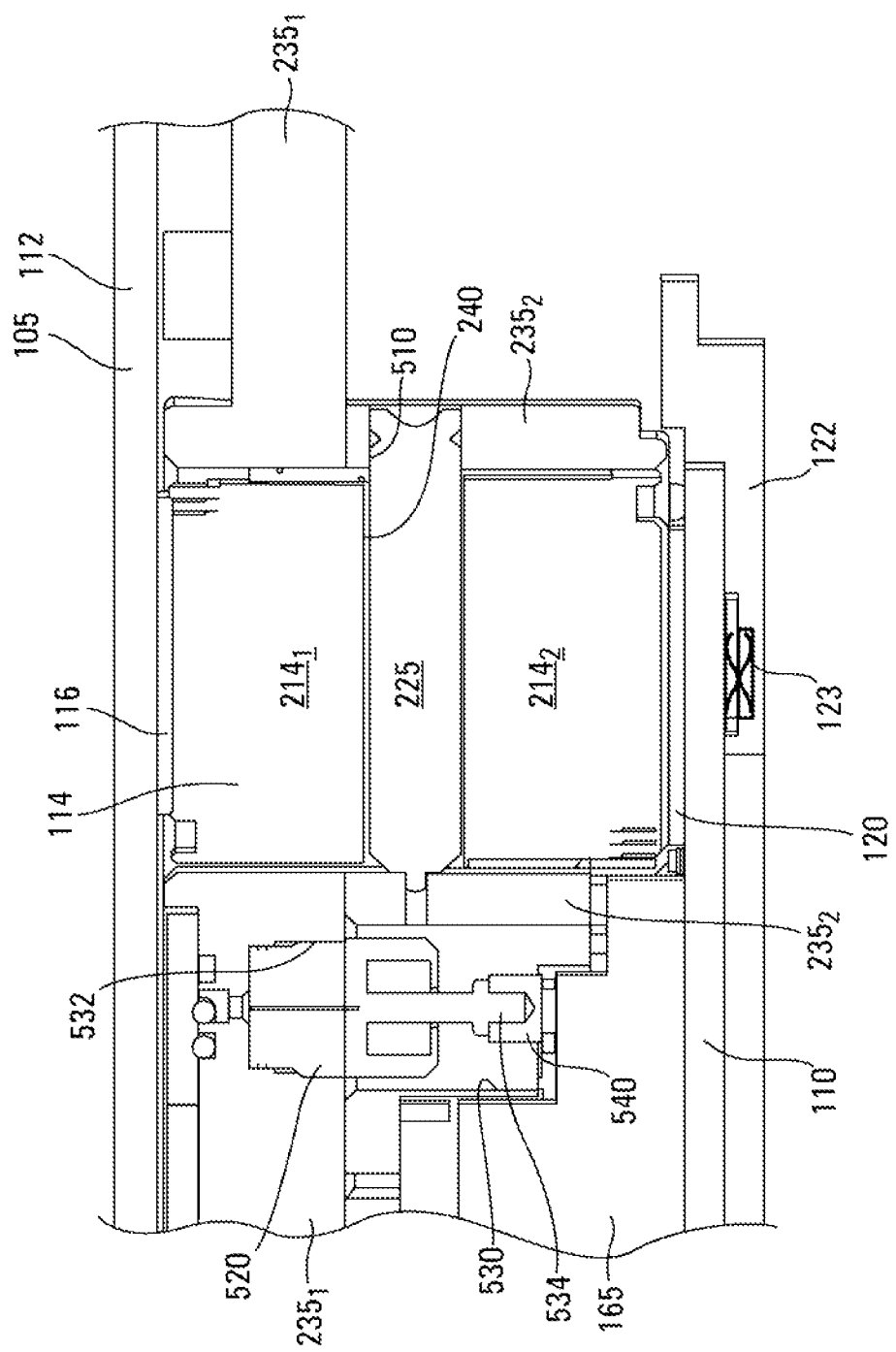
FIG. 7 is a cross-section illustrating an example of a portion of an ejection system of an interface, according to another embodiment.

FIG. 7 is a cross-section (with cross hatching omitted) illustrating an example of a portion of an ejection system of interface 100 configured to eject probe card 110 from interface 100 when tester 105 is electrically and physically connected to interface 100, where the portion of FIG. 7 corresponding to interface 100 is a cross-section viewed along line 7-7 in FIG. 1A. Note that FIG. 7 shows a connector $214_1$ of connector assembly 114 physically and electrically connected to a respective connector 116 of backplane 112 of tester 105, and a connector $214_2$ of connector assembly 114 physically and electrically connected to a respective connector 120 of probe card 110. FIG. 7 further shows that pin 225 is pivotally coupling connector assembly 114 to plate $235_2$ of body 125. FIG. 7 also illustrates tray 122 and a spring 123 interposed between tray 122 and probe card 110 and exerting a force on probe card 110. Probe card 110 may include a stiffener 165, such as a plate, at its center, as shown in FIGS. 1A and 7.

For some embodiments, the ejection system may include a plurality of actuators 520, as shown in FIGS. 5 and 7, that may be air driven piston/cylinder assemblies or electrically driven solenoids. Actuators 520 may be located adjacent to respective ones of connector assemblies 114, as shown in FIGS. 5 and 7. For example, there may be an actuator 520 adjacent to each connector assembly 114, as shown in FIG. 5.

Each actuator 520 may be located in an opening 530 in plate $235_2$, as shown in FIGS. 5 and 7. When plates $235_1$ and $235_2$ are butted together, a portion of each actuator 520 extends into a respective opening 532 in plate $235_1$ so that the respective actuator is seated against the plate $235_1$ at the bottom of the respective opening, as shown in FIG. 7. As such, an opening 530 and a respective opening 532 form a cavity within body 125 of interface 100 for containing a respective actuator 520, so that each cavity contains a respective one of the actuators 520. An actuator rod 534 (FIGS. 5 and 7), e.g., coupled to a piston for embodiments where the actuator is a piston/cylinder assembly, of each actuator 520 is aligned with a portion of stiffener 165 of probe card 110, as shown in FIG. 7.

To eject probe card 110 from interface 100, actuators 520 are activated, e.g., pneumatically or electrically, causing actuator rods 534 to extend into engagement with stiffener 165 of probe card 110. As they extend in engagement with stiffener 165, actuator rods 534 push probe card 110 from interface 100, thereby physically and electrically disconnecting connectors 120 of probe card 110 from respective ones of connectors $214_2$ of interface 100. For some embodiments, a cap 540 may be located on an end of each actuator rod 534, as shown in FIGS. 4-7, for engaging stiffener 165.

For other embodiments, the ejection system may include a plurality of elastic devices, such as a plurality of springs (not shown), as the actuators, where the springs may be located within respective ones of the cavities formed by openings 530 and 532. The springs may be in contact with and compressed by stiffener 165 of probe card 110, when probe card 110 is electrically and physically coupled to interface 100 and the external force is being applied to probe card tray 122, so that the force exerted by the springs on stiffener 165 exceeds the force required to eject probe card 110 from interface 100. To eject probe card 110 from interface 100, the external force is removed from probe card 110 and the springs push probe card 110 from interface 100 as they extend.

Note that using individual plates $235_1$ and $235_2$ facilitates the installation of the actuators and the installation of the connector assemblies. For example, the actuators and the connector assemblies may be installed in plate $235_2$ as shown in FIG. 5, and subsequently plates $235_1$ and $235_2$ may be butted together, as shown in FIG. 3.

Figure 8:
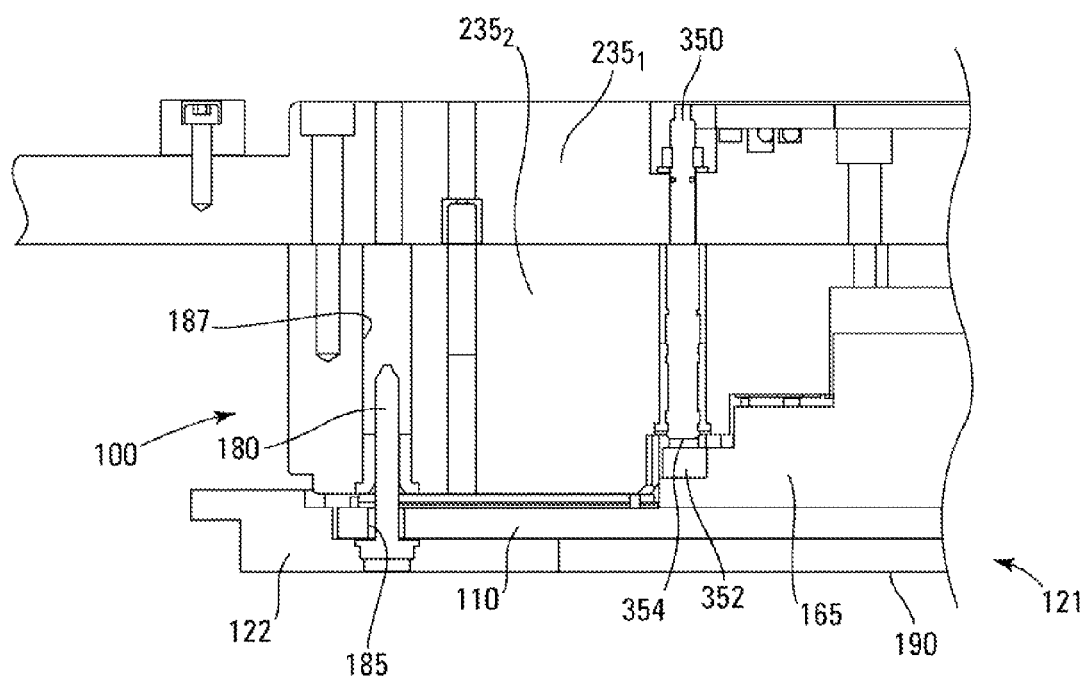
FIG. 8 is a cross-section illustrating a portion of a leveling system of an interface, according to another embodiment.

For some embodiments, interface 100 may include a leveling system, such as a three-point leveling system that may include three individually adjustable leveling studs 350, as shown FIGS. 3-5 and FIG. 8, a cross-sectional view (cross-hatching omitted) with probe card 110 electrically and physically coupled to interface 100, where the portion of FIG. 8 corresponding to interface 100 is a cross-section viewed along line 8-8 in FIG. 1A.

Leveling studs 350 may be threadably coupled to, e.g., in threaded engagement with, plate $235_1$ and/or plate $235_2$. Each leveling stud 350 may be adjusted by rotating the respective leveling stud 350 relative to interface 100, e.g., using a tool, such as a wrench. For example, rotating the respective leveling stud 350 in one angular direction causes that leveling stud 350 to extend from plate $235_2$ toward probe card 110, and rotating the respective leveling stud 350 in an opposite angular direction causes that leveling stud 350 to retract into plate $235_2$ away from probe card 110.

Each of leveling studs 350 may be aligned with stiffener 165, as shown in FIG. 8, and may directly contact stiffener 165 or may directly contact a respective block 352 (e.g., sometimes called a leveling coupon) located on stiffener 165, as shown in FIG. 8, when connectors $214_2$ are coupled to connectors 116 of probe card 110. For example, each leveling stud 350 may correspond to a respective one of blocks 352, meaning there may be one block 352 for each leveling stud 350. For some embodiments, leveling studs 350 are adjusted so that their respective ends 354 (FIG. 8) lie a plane that is substantially parallel (e.g., to within about 2 microns) to a semiconductor component being adjusted.

As indicated above in conjunction with FIGS. 1A and 1B, for some embodiments, probe card 110 may be located in and, e.g., fastened to, tray 122. A pair of alignment pins 180 may extend from an interior of tray 122 (FIGS. 1B and 8). Each alignment pin 180 may pass through an opening 185 in probe card 110 when probe card 110 is in tray 122, as shown in FIG. 8. Each alignment pin 180 may then extend into an opening 187 in plate $235_2$ of interface 100 when probe card 100 is physically and electrically coupled to interface 100, as shown in FIG. 8.

When the external force is applied to the tray 122, e.g. by the prober, to hold probe card assembly 121 against interface 100, springs 123 may exert a force on probe card 110 that acts to push stiffener 165 or blocks 352 located on stiffener 165 against the ends 354 of leveling studs 350. The presence of springs 123 enable probe card 110 to move, e.g., into a leveled position, relative to tray 122 and against springs 123 when the prober is exerting the external force on probe tray 122.

For some embodiments, leveling of probe card 110 may occur after tester 105 is physically and electrically coupled to interface 100. For example, leveling probe card 110 may include, e.g., while tester 105 is physically and electrically coupled to interface 100, positioning probe card assembly 121 on interface 100, e.g., using the prober to apply a force on tray 122. A camera, e.g., on the prober, may then be used to determine whether probe card 110 is level, e.g., whether a surface 190 (FIG. 8) of probe card 110 that will face the semiconductor components during testing is substantially parallel (e.g., within about 2 microns) to the semiconductor components.

If surface 190 is not level, probe card assembly 121 is removed and leveling studs 350 are adjusted. Probe card assembly 121 is then positioned back on interface 100 and the camera may be used to determine whether probe card 110 is level. If probe card 110 is not level, the process is performed iteratively until probe card 110 is level. When probe card 110 is level, leveling is completed. This places leveling studs 350 in a position to allow subsequent, repeated positioning of probe card 110 on interface 100 without further adjustment of leveling studs 350. In other words, leveling studs 350 are in a position to allow for repeated positioning of probe card 110 on interface 100 without having to level for each positioning.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An interface, comprising:
    a body;
    a plurality of connector assemblies, each connector assembly in a single opening of a plurality of openings passing completely through the body;
    wherein each connector assembly comprises first and second connectors that are electrically and physically coupled to each other;
    wherein a respective pin passes substantially radially through a sidewall of the body and between the first and second connectors of each connector assembly; and
    wherein each connector assembly is configured to pivot as a single unit about the respective pin relative to the body.

2. The interface of claim 1, wherein each connector assembly further comprises a circuit board that electrically and physically couples the first and second connectors to each other.

3. The interface of claim 1, wherein the first and second connectors of each connector assembly each comprise a plurality of conductors.

4. The interface of claim 1, wherein the first connectors of the plurality of connector assemblies are configured to electrically and physically couple to respective ones of a plurality of connectors of a tester and the second connectors of the plurality of connector assemblies are configured to electrically and physically couple to respective ones of a plurality of connectors of a probe card assembly.

5. The interface of claim 4, wherein the probe card assembly comprises:
    a probe card;
    a tray; and
    a plurality of springs interposed between the tray and the probe card.

6. The interface of claim 5, further comprising second openings adjacent to respective ones of the first connectors for receiving alignment posts adjacent to respective ones of the connectors of the tester and/or third openings adjacent to respective ones of the second connectors for receiving alignment posts adjacent to respective ones of the connectors of the probe card assembly.

7. The interface of claim 1, further comprising a leveling system.

8. The interface of claim 7, wherein the leveling system is a three-point leveling system.

9. The interface of claim 7, wherein the leveling system comprises a plurality of adjustable leveling studs.

10. The interface of claim 9, wherein each of the leveling studs is configured to contact a probe card, when the probe card is electrically and physically coupled to the plurality of connector assemblies.

11. The interface of claim 1, further comprising an ejection system configured to eject an interconnection device from the interface.

12. The interface of claim 11, wherein the ejection system comprises one or more actuators selected from the group consisting of pneumatic devices, electrical devices, and elastic devices.

13. The interface of claim 1, wherein the openings of the plurality of openings are physically isolated from each other.

14. The interface of claim 1, wherein each opening comprises first and second contiguous openings respectively passing through first and second abutted portions of the body.

15. The interface of claim 1, wherein the interface is configured to allow the first connector of each connector assembly to be electrically coupled to a third connector without being fully seated within the third connector and/or to allow the second connector of each connector assembly to be electrically coupled to a fourth connector without being fully seated within the fourth connector.

16. An interface, comprising:
    a body;
    a plurality of connector assemblies, each connector assembly comprising first and second connectors and conductors that electrically and physically couple the first and second connectors to each other;
    wherein a respective pin passes substantially radially through the body and between the first and second connectors of each connector assembly and pivotally couples that connector assembly to the body; and
    wherein each connector assembly is configured to pivot as a single unit about the respective pin.

17. The interface of claim 16, further comprising a plurality of actuators, the actuators adjacent to respective ones of the connector assemblies and located within cavities within the body, each actuator configured to exert a force on a probe card for physically and electrically disconnecting connectors of the probe card from respective ones of the plurality of connector assemblies.

18. An interface, comprising:
    a body comprising first and second abutted portions, each portion comprising a plurality of openings, the openings in the first portion contiguous with respective ones of the openings in the second portion; and a plurality of connector assemblies physically coupled to the first portion, the connector assemblies in respective ones of the contiguous first and second openings;

wherein each connector assembly comprises first and second connectors and a circuit board that electrically couples the first and second connectors to each other and that substantially rigidly physically couples the first and second connectors to each other; and wherein each connector assembly is pivotally coupled to the first portion by a respective pin that passes substantially radially through a sidewall of the first portion and that passes between the first and second connectors of that connector assembly; and wherein each connector assembly is configured to pivot as a single unit about the respective pin.

19. An interface, comprising:

a body;

a plurality of connector assemblies, each connector assembly in a single opening of a plurality of openings passing completely through the body;

an adjustable leveling system configured to contact a device when the device is electrically and physically coupled to the plurality of connector assemblies; and an ejection system configured to physically and electrically decouple the device from the plurality of connector assemblies;

wherein the interface is configured to allow each connector assembly to be electrically coupled to a respective connector of the device while a gap separates an end of that connector assembly from a seat of the respective connector of the device;

wherein each connector assembly comprises first and second connectors substantially rigidly physically coupled to each other; and wherein each connector assembly is configured to pivot as a single unit relative to the body about a respective pin that passes substantially radially through a sidewall of the body and that is between the first and second connectors of that connector assembly.

20. An interface, comprising:

a body comprising a plurality of openings passing completely therethrough, the openings physically isolated from each other; and a plurality of connector assemblies, the connector assemblies located in respective ones of the openings, each connector assembly comprising first and second connectors and a circuit board that electrically and physically couples the first and second connectors to each other;

wherein each connector assembly is configured to pivot as a single unit about a pin that is between the first and second connectors of that connector assembly in response to that connector assembly engaging a connector of a device being electrically and physically coupled to the interface; and wherein each pin passes substantially radially through a sidewall of the body.

* * * * *